United States Patent [19]
Tietsworth

[11] Patent Number: 5,999,889
[45] Date of Patent: Dec. 7, 1999

[54] ANTENNA PERFORMANCE MONITOR

[75] Inventor: Steven C. Tietsworth, San Diego, Calif.

[73] Assignee: The United States of America as represented by the Secretary of the Navy, Washington, D.C.

[21] Appl. No.: 08/869,115

[22] Filed: Jun. 4, 1997

[51] Int. Cl.[6] ..................................... G21H 5/00
[52] U.S. Cl. ................. 702/65; 702/64; 702/75; 375/347; 375/349; 455/138; 455/276.1; 455/504; 455/63
[58] Field of Search ................................. 702/65, 64, 75, 702/182, 189; 375/347, 349, 346; 455/138, 276.1, 278.1, 504, 506, 63, 65, 137

[56] References Cited

U.S. PATENT DOCUMENTS 5,233,537  8/1993  Tietsworth .
5,887,038  3/1999  Golden ..................................... 375/347

*Primary Examiner*—Thomas R. Peeso
*Attorney, Agent, or Firm*—Harvey Fendelman; Michael A. Kagan; Eric James Whitesell

[57] ABSTRACT

An antenna performance monitor comprises an antenna sensor for coupling to an antenna radiating a radio frequency signal. The antenna sensor generates signals Vm and Im representative of the antenna input voltage and current. An A/D converter is coupled to the antenna sensor for digitizing signals Vm and Im. A data processor is coupled to the A/D converter for generating outputs representative of impedance magnitude and phase angle of the antenna substantially concurrently with changes in frequency of the radio frequency signal.

7 Claims, 4 Drawing Sheets

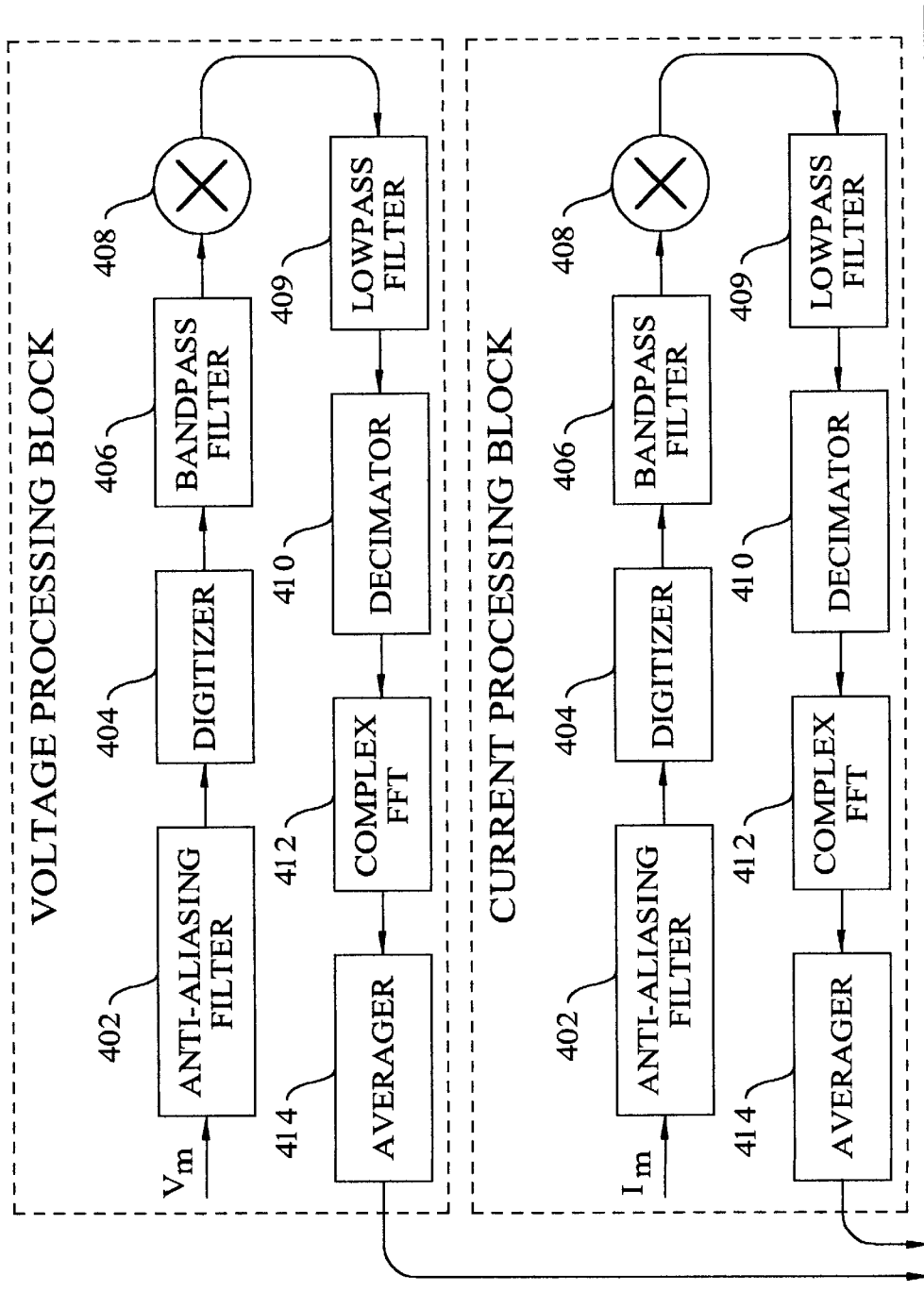

ANTENNA PERFORMANCE MONITOR

LICENSING INFORMATION

The invention described below is assigned to the United States Government and is available for licensing commercially. Technical and licensing inquiries may be directed to Harvey Fendelman, Patent Counsel, Space and Naval Warfare Systems Center, Code D0012, 53510 Silvergate Avenue Room 103, San Diego, Calif. 92152-5765; telephone no. (619)553-3818; fax no. (619)553-3821.

BACKGROUND OF THE INVENTION

The present invention relates to the measurement of antenna performance parameters in real time. More specifically, but without limitation thereto, the present invention relates to the measurement of voltage, current, resistance, and reactance of a transmitting antenna during normal broadcast.

Previous methods for measuring antenna performance typically required the transmission of a CW signal, which meant interrupting normal communications during the measurement period. The possibility of an undetected malfunction while the transmitter was operating is a factor limiting the confidence in the capability of a communications system.

U.S. Pat. No. 5,233,537 issued on Aug. 3, 1993 and incorporated herein by reference thereto describes a system that solves the problem of testing an antenna while transmitting a frequency shift-keyed signal. FIG. 2 of this patent shows the four components used to measure antenna operating parameters: a sensor to generate a signal representative of antenna feed point voltage and current, a sampling trigger circuit, an A/D converter, and a data processing unit to calculate antenna performance from the sampled voltage and current. Because the antenna parameters change with the frequency of the signal being transmitted, the sampling trigger is required to gate samples to the A/D converter during the time periods when the frequency being measured is transmitted. Separate measurements are performed at each transmission frequency.

A continuing need still exists, however, for an antenna performance monitor that is not dependent on knowledge of the frequency excursions of the transmitted signal.

SUMMARY OF THE INVENTION

An antenna performance monitor of the present invention is directed to overcoming the problems described above, and may provide further related advantages. No embodiment of the present invention described herein shall preclude other embodiments or advantages that may exist or become obvious to those skilled in the art.

An antenna performance monitor of the present invention comprises an antenna sensor for coupling to an antenna radiating a radio frequency signal. The antenna sensor generates signals Vm and Im representative of the antenna input voltage and current. An A/D converter is coupled to the antenna sensor for digitizing signals Vm and Im. A data processor is coupled to the A/D converter for generating outputs representative of impedance magnitude and phase angle of the antenna substantially concurrently with changes in frequency of the radio frequency signal.

An advantage of the antenna performance monitor is that the performance parameters of an antenna may be measured while connected to an operating transmitter.

Another advantage is that no sampling trigger is required to select specific transmission frequencies.

Yet another advantage is that antenna performance parameters may be broadcast virtually in real time within the transmitted signal or over other comunnication links.

The features and advantages summarized above in addition to other aspects of the present invention will become more apparent from the description, presented in conjunction with the following drawings.

DESCRIPTION OF THE INVENTION

The following description is presented solely for the purpose of disclosing how the present invention may be made and used. The scope of the invention is defined by the claims.

Figure 1:
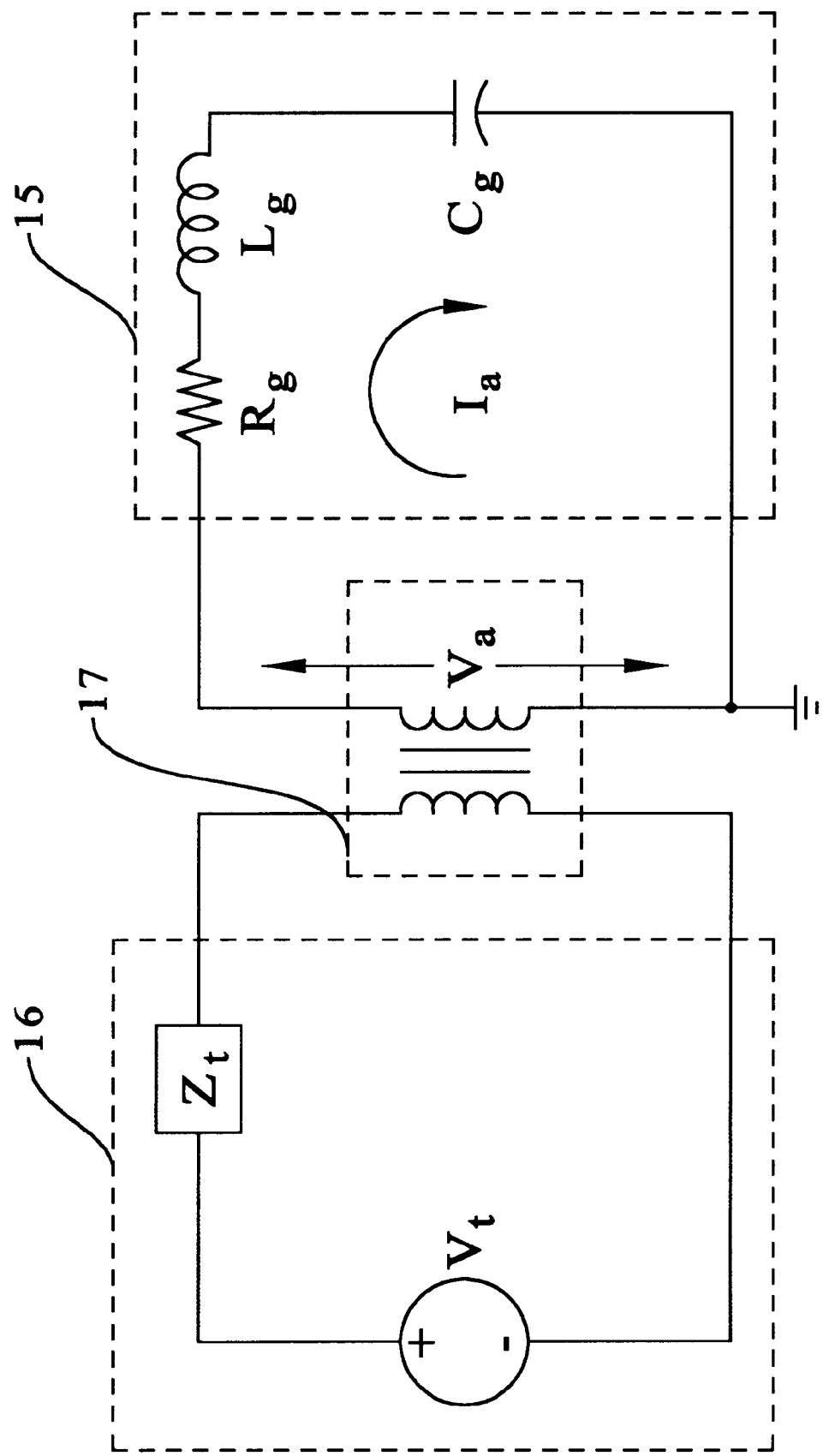
FIG. 1 is an electrical schematic of an equivalent circuit for a typical antenna system.

FIG. 1 diagrams an equivalent circuit for a typical transmitting antenna 15. Transmitter 16 is represented by voltage source Vt in series with impedance Zt to model the reactance and losses in the transmitter. An impedance matching transformer 17 is typically used to match impedance Zt to the antenna impedance. The antenna impedance comprises gross resistance Rg, gross inductance Lg, and gross capacitance Cg. Cg includes the stray capacitive reactance of the antenna coupling to ground and the connecting cables. Lg includes the inductive reactance of the stray inductance in the connecting cables and the series inductance of a tuning coil or variometer typically used for tuning the resonant frequency of the antenna. Rg includes the resistance of the antenna feed cables and the antenna structure causing power to be lost as heat and the radiation resistance of the antenna. The voltage at the antenna feed point is designated as Va, and the current as Ia. The antenna voltage and current are functions of time that characterize the antenna impedance characteristics described above.

Antenna voltage Va and current Ia may be measured according to well known techniques when the antenna is operating with a single frequency sinusoidal signal, but in modulated signals such as frequency shift keying each single frequency signal is of such short duration that measuring Va and Ia becomes a significant problem.

Figure 2:
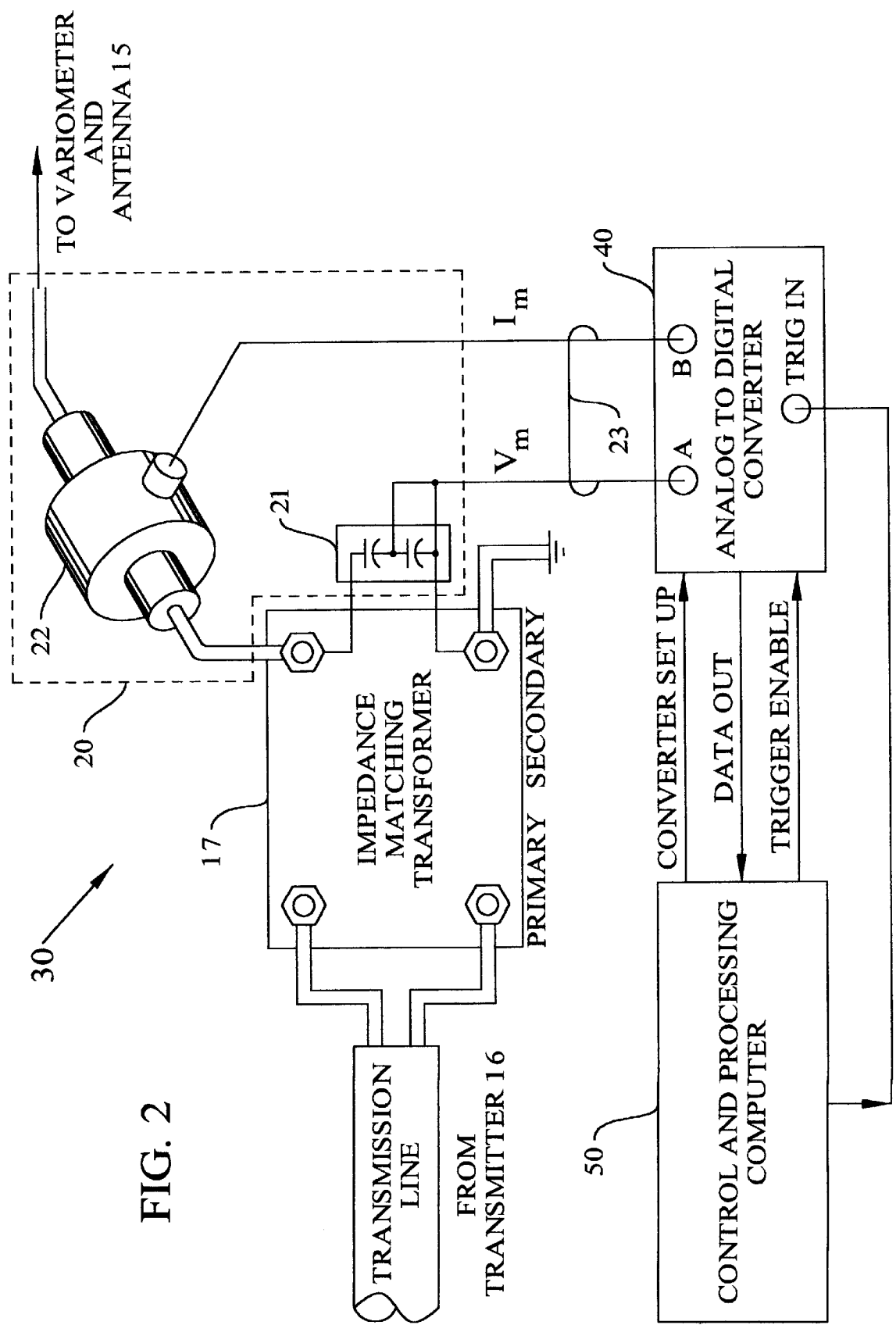
FIG. 2 is a diagram of an antenna performance monitor of the present invention.

Referring now to FIG. 2, antenna performance monitor 30 comprises antenna sensor 20, A/D converter 40, and data processor 50. Antenna sensor 20 comprises a capacitive voltage divider 21 connected between the antenna feedpoint at impedance transformer 17 and ground to generate antenna input voltage signal Vm and a current probe 22 connected in series with antenna 15 to generate antenna input current signal Im. The capacitors in voltage divider 21 have a capacitance ratio and a series reactance selected to scale antenna voltage Va to an appropriate voltage signal Vm. Current probe 22 senses antenna current Ia and generates a corresponding voltage signal Im. Current probe 22 may be, for example, a Pearson Electronics Model 310 RF Current Transformer.

In operation, voltages Vm and Im are input to A/D converter 40. A/D converter 40 may be, for example, a Rapid Systems Model R2000 Analog to Digital Converter. Signals Vm and Im may be conducted to A/D converter 40 by signal link 23. Signal link 23, may be, for example, a double shielded cable to minimize interference from the magnetic field of the antenna. Alternatively, signal link 23 may be a fiber optic transmitter and receiver link for each of signals Vm and Im, such as a Dymec Model 6721 Fiber Optic Transmitter and Model 6722 Fiber Optic Receiver. A/D converter 40 is initialized and triggered by data processor 50 to digitize signals Vm and Im. The digitized Vm and Im data output from A/D converter 40 are input to data processor 50. A/D converter 40 typically includes anti-aliasing filters to filter out signals having frequencies higher than half the A/D sample rate. The sample rate should be higher than twice the highest transmitter signal frequency.

Figure 3B:
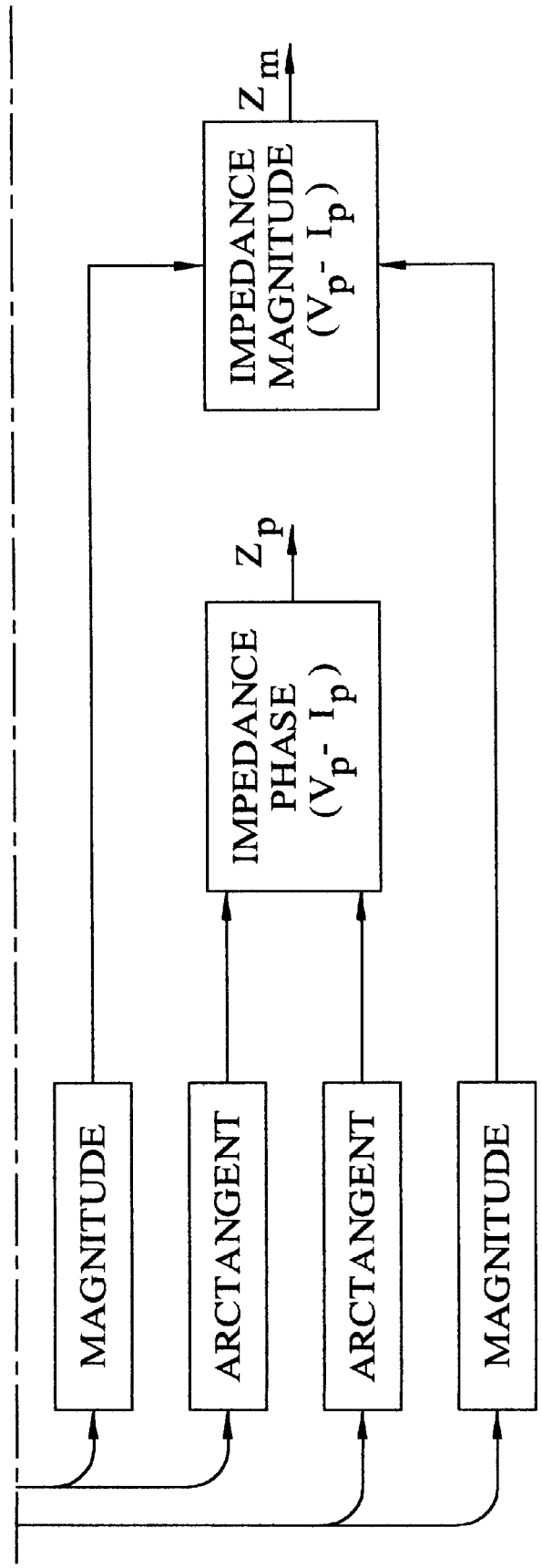
FIG. 3 is a flow chart of a computer program for calculating the antenna impedance magnitude and phase.

FIG. 3 is a flow chart exemplifying the processing of signals Vm and Im through A/D converter 40 and data processor 50. Signals Vm and Im are anti-aliased by filters 402 and digitized by digitizers 404. The digitized samples are then bandpass-filtered by bandpass filters 406 to remove out-of-band frequencies and base-banded by complex mixers 408. The base-banded complex data is lowpass filtered by lowpass filters 409 and resampled by decimators 410 to a sample rate appropriate to the modulation bandwidth of the radio frequency signal. The decimated data is then subjected to a complex FFT 412. FFT 412 may have, for example, 1024 points. The complex FFT data is averaged over, for example, a 500 point evenly weighted average by averagers 414 resulting in frequency bin averages for Vm and Im at each of the frequencies in the modulation bandwidth of the radio frequency signal. Magnitude functions 416 generate the magnitude of Vm and Im respectively by calculating the square root of the sum of the squares of the real and imaginary coefficients of signals Vm and Im respectively for each frequency bin. Arctangent functions 418 generate the phase angles of Vm and Im by calculating the arctangent of the ratio of the real to the imaginary coefficients for each frequency bin. Impedance magnitude function 420 divides the magnitude of Vm by the magnitude of Im to output the impedance magnitude Zm for each frequency bin. Impedance phase function 422 subtracts the phase angle of Im from the phase angle of Vm to output impedance phase angle Zp for each frequency bin. Rg, Lg, Cg, and the resonant frequency of the antenna may be found from Zm and Zp at two or more frequencies as described in U.S. Pat. No. 5,233,537, included herein by reference thereto. The resonant frequency of the antenna and Rg may also be found by selecting the frequency bin having an impedance phase angle Zp closest to zero. The corresponding impedance magnitude Zm at this frequency is approximately Rg. The reactance for each frequency may also be found by subtracting Rg from Zm of the corresponding frequency bin. The resulting antenna performance parameters may be displayed according to well known techniques or transmitted to a remote location for further processing.

Other modifications, variations, and applications of the present invention may be made in accordance with the above teachings other than as specifically described to practice the invention within the scope of the following claims.

I claim:

1. An antenna performance monitor comprising:
   an antenna sensor for coupling to an antenna radiating a radio frequency signal, wherein said antenna sensor generates signals Vm and Im representative of an input voltage and an input current respectively of said antenna;
   an A/D converter coupled to said antenna sensor for digitizing samples of said signals Vm and Im; and
   a data processor coupled to said A/D converter for generating outputs representative of an impedance magnitude and an impedance phase angle of said antenna substantially concurrently for each frequency of said radio frequency signal.

2. The antenna performance monitor of claim 1 wherein said antenna sensor comprises a capacitive voltage divider and a current transformer.

3. The antenna performance monitor of claim 1 wherein said A/D converter comprises anti-aliasing filters.

4. The antenna performance monitor of claim 1 wherein said A/D converter comprises a digitizer having a sampling rate of at least twice a highest frequency of said radio frequency signal.

5. The antenna performance monitor of claim 1 wherein said antenna sensor is coupled to said A/D converter by a double shielded coaxial cable.

6. The antenna performance monitor of claim 1 wherein said antenna sensor is coupled to said A/D converter by a fiber optic link.

7. The antenna performance monitor of claim 1 wherein said data processor comprises the following functions:
   a bandpass filter coupled to said A/D converter having a center frequency substantially equal to a midpoint of said radio frequency signal for bandpass filtering said samples of said signals Vm and Im;
   a mixer coupled to said bandpass filter for forming a complex product of said samples of said signals Vm and Im with a signal representative of each frequency respectively in said radio frequency signal;
   a lowpass filter coupled to said mixer for generating a filtered complex baseband of said complex product;
   a decimator coupled to said lowpass filter for generating a resampled complex baseband of said filtered complex baseband at a reduced sample rate;
   a complex FFT transform coupled to said decimator for generating complex spectral coefficients of said signals Vm and Im from said resampled complex baseband;
   an averager coupled to said complex FFT transform for generating averaged complex spectral coefficients of said signals Vm and Im from said spectral coefficients;
   a voltage magnitude function coupled to said averager for generating a voltage magnitude of said averaged complex spectral coefficients for said samples of said signal Vm;
   a current magnitude function coupled to said averager for generating a current magnitude of said averaged complex spectral coefficients for said samples of said signal Im;
   a magnitude divide function coupled to said voltage magnitude function and said current magnitude function for generating the quotient of said voltage magnitude divided by said current magnitude for a plurality of frequencies within said radio frequency signal;
   a voltage divide function coupled to said averager for generating a voltage quotient of each real part of said averaged complex spectral coefficients for said signal Vm divided by its corresponding imaginary part;
   a current divide function coupled to said averager for generating a current quotient of each real part of said averaged complex spectral coefficients for said signal Im divided by its corresponding imaginary part;
   a voltage arctangent function coupled to said voltage divide function for generating a voltage phase signal from each said voltage quotient;
   a current arctangent function coupled to said current divide function for generating a current phase signal from each said current quotient; and
   a difference function coupled to said voltage arctangent function and said current arctangent function for generating the difference of said voltage phase signal minus said current phase signal for said plurality of frequencies in said radio frequency signal.

* * * * *